United States Patent [19]
Brianti et al.

[11] Patent Number: 5,644,267
[45] Date of Patent: Jul. 1, 1997

[54] HIGH-PASS FILTER STRUCTURE WITH PROGRAMMABLE ZEROS

[75] Inventors: Francesco Brianti, Piacenza; Roberto Alini, Stradella; Valerio Pisati, Bosnasco; Paolo Gadducci, Tirrenia, all of Italy

[73] Assignee: SGS-Thomson Microelectronics, S.r.l., Agrate Brianza, Italy

[21] Appl. No.: 455,850

[22] Filed: May 31, 1995

[30] Foreign Application Priority Data

Aug. 12, 1994 [EP] European Pat. Off. ............. 94830401

[51] Int. Cl.⁶ ........................................... H03F 3/68
[52] U.S. Cl. ........................ 327/553; 327/552; 327/103; 330/305
[58] Field of Search ............................. 327/551, 552, 327/553, 555, 556, 557, 558, 559, 103, 560; 330/107, 109, 294, 305, 303

[56] References Cited

U.S. PATENT DOCUMENTS 5,357,208 10/1994 Nelson ................................. 327/552

OTHER PUBLICATIONS

R. L. Geiger et al., "Active Filter Design Using Operational Transconductance Amplifiers: A Tutorial," IEEE Circuits and Devices Magazine, vol. 1, No. 2, p. 20 (1985).

A. P. Nedungadi et al., "High–Frequency Voltage Controlled Continuous–Time Lowpass Filter Using Linearized CMOS Integrators," Electronics Letters, vol. 22, No. 14, p. 729 (1986).

*Primary Examiner*—Timothy P. Callahan
*Assistant Examiner*—Dinh T. Le
*Attorney, Agent, or Firm*—Robert Groover; Betty Formby; Matthew Anderson

[57] ABSTRACT

A high-pass filter in particular for high-frequency applications and of the type comprising at least one input terminal (IN) and at least one output terminal (OUT) between which is defined a transfer function (FdT) and is inserted a biquadratic cell (18) incorporating a series of transconductance stages (2, 3, 4, 5) comprises a generator circuit (29) of variable currents ($i_{K1}$, $i_{K2}$) connected between a pair of stages (2, 3) of the biquadratic cell (18) and a voltage reference (GND). Said generator allows introduction of programmable zeroes in the transfer function (FdT) of the filter (20).

7 Claims, 4 Drawing Sheets

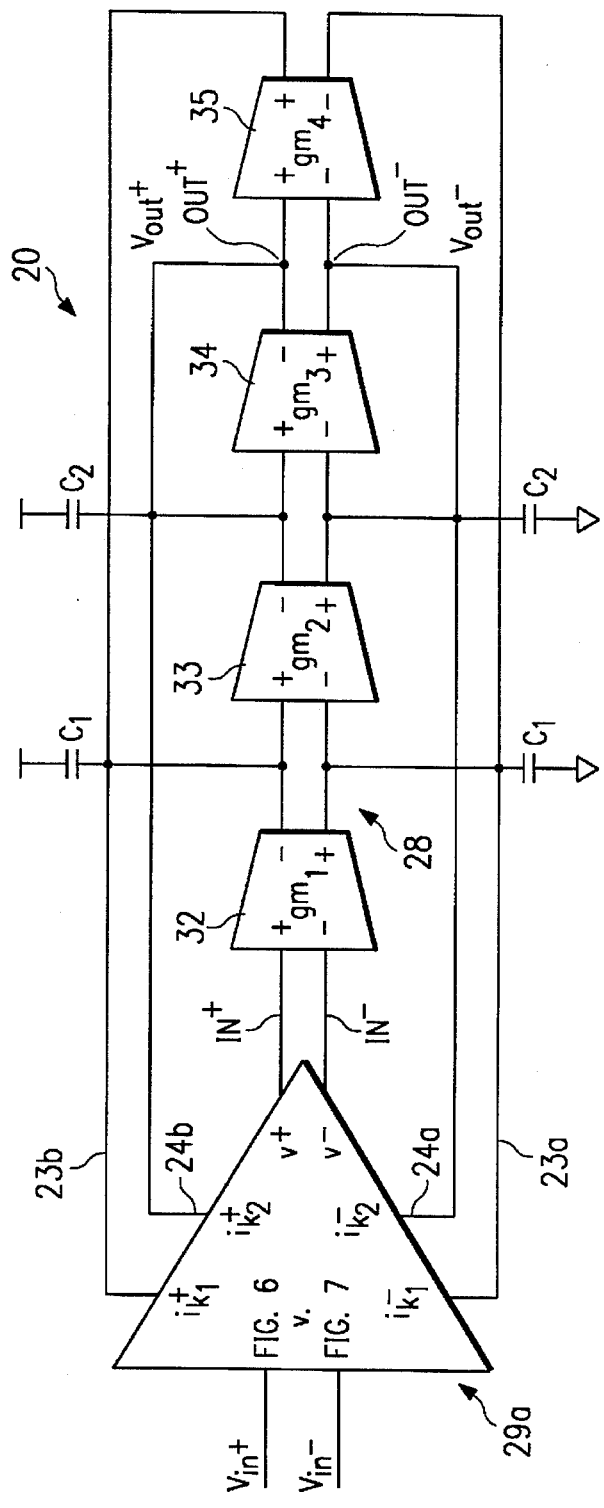
FIG. 6
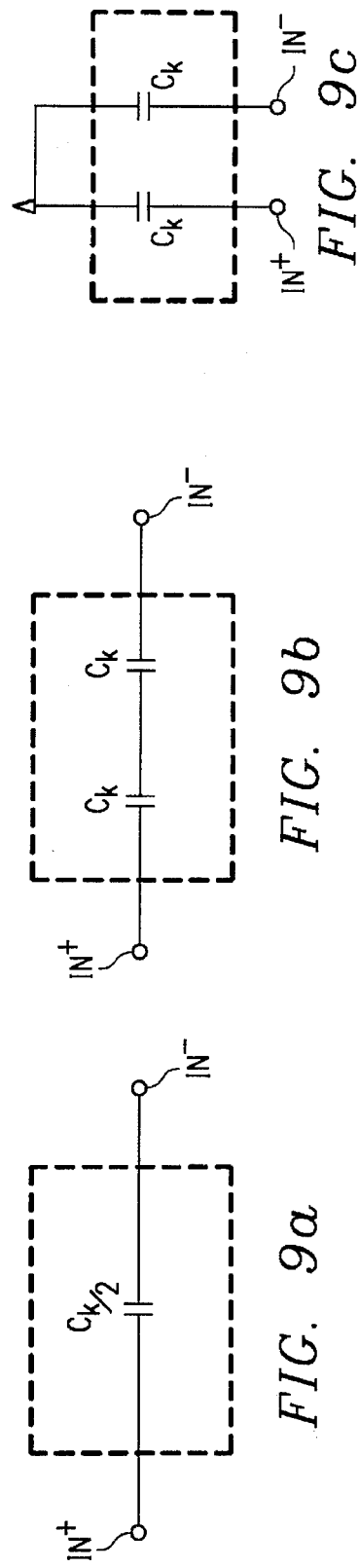
FIG. 9a
FIG. 9b
FIG. 9c

HIGH-PASS FILTER STRUCTURE WITH PROGRAMMABLE ZEROS

DESCRIPTION

1. Field of Application

The present invention relates to a programmable-zeros filter specifically for high-frequency applications.

More specifically the present invention relates to a high-pass filter in particular for high-frequency applications and of the type comprising at least one input terminal and at least one output terminal between which is defined a transfer function and is inserted a biquadratic cell incorporating a series of transconductance stages.

2. Known Art

As known, the greater part of filters for high-frequency applications can be provided starting from low-pass biquadratic cells an example of which is shown in FIG. 1.

The cell 1 of FIG. 1 has a conventional structure as shown for simplicity of description in a single-ended configuration. For the cell 1 it is however possible to provide configuration of the fully-differential type which improves rejection of common mode signals and disturbances from the power lines.

The cell 1 has an input terminal IN and an output terminal OUT between which is inserted the cascade of a first 2, a second 3 and a third 4 transconductance stages.

A fourth stage 5 is connected with a feedback 19 between an output of the third stage 4 and an input of the second stage 3.

The first stage 2 has an input 6 connected directly with the input terminal IN of the cell 1 and designed to receive a voltage signal Vin. This first stage 2 has its output 7 connected to an input terminal 8 of the second stage 3 forming a first circuit node A.

The circuit node A is connected to a voltage reference, e.g. a signal ground GND, by means of a first capacitor C1.

The second stage 3 has in turn an output 9 connected to an input 10 of the third stage 4 forming a second circuit node B.

Even the circuit node B is connected to ground by means of a second capacitor C2.

The third stage 4 has an output 11 connected to an input 12 of the fourth transconductance stage 5 by means of a feedback connection 19 and the output 11 coincides virtually with the second node B. This circuit node B coincides also with the output terminal OUT of the cell 1 from which is taken an output voltage Vout.

As mentioned above, the fourth transconductance stage 5 has an output terminal 13 connected in feedback to the first circuit node A.

The transfer function, i.e. the relationship between the Laplace transform of the input and output signal of the cell 1 in the case of real capacitance which exhibit a parallel resistance at output equal to R, is given by the following relationship:

$$FdT = V(s)\text{out}/V(s)\text{in}$$

In high-frequency applications, e.g. video recorders or television sets, or in digital disc readers, in addition to the biquadratic cells of the type discussed above, there become necessary circuitry structures which provide the high-pass or all-pass functions to manipulate in the best manner the signal subjected to the filtering operation.

The high-pass or all-pass functions are obtained generally starting from a biquadratic cell 1 of the low-pass type such as that discussed with reference to FIG. 1.

A first known solution as shown in FIG. 2 is virtually taken from the cell 1 replacing the capacitors C1 and C2 with respective variable capacitors CV1 and CV2. Said variable capacitors CV1, CV2 are connected between the circuit nodes A and B respectively and the input terminal 6 of the first stage 2.

The biquadratic cell thus obtained, which we shall indicated by reference number 14, is the high-pass type but is not immune to its own shortcomings because of the variable and floating capacitances imposed by a high capacitive load at input.

Furthermore the transfer function FdT of this cell 14 exhibits at the numerator some "zeros" which are difficult to vary or modify.

The known art proposes also a second solution, again taken from the biquadratic cell 1 of low-pass type.

This second solution is indicated by 15 in FIG. 3 and proposes the introduction of operational amplifiers 16 and 17 with variable gain K1 and K2 and inserted between the capacitors C1 and C2 and the input terminal 6. In this manner there is obtained a biquadratic cell 15 of high-pass type which permits obtaining the variability of the zeros present at the numerator of the transfer function.

However, this second solution exhibits in turn various drawbacks. In the first place the cell 15 is unusable for low supply voltages Vdd and in particular when the input signal Vin is greater than the smaller of the relationships Vdd/K1 and Vdd/K2. This drawback limits the maximum amplitude of the input signal which can be handled or the field of variability of the gains K1 and K2 once a predetermined power voltage Vdd has been fixed.

In addition the cell 15 introduces strong signal distortions if the transmission delays for the paths indicated in the figures by PATH1, PATH2 and PATH3 are unequal. Since the first PATH1 of said paths is very fast and high-frequency, even the second PATH2 and the third path PATH3 should be equally fast.

Unfortunately, to speed up these other paths PATH2 and PATH3 would require a strong bias current of the operational amplifiers 16 and 17 and this would have for its immediate consequence a high power dispersal.

Lastly, even the structure of FIG. 3 does not eliminate floating capacitance.

The technical problem underlying the present invention is to conceive a high-pass filter structure having structural and functional characteristics capable of overcoming the shortcomings which still afflict the devices provided in accordance with the known art.

Specifically the technical problem is to conceive a biquadratic cell operating on low voltage power supply and not requiring the presence of floating capacitance and having low capacitive load at input.

SUMMARY OF THE INVENTION

The solution idea underlying the present invention is to make available a filter structure having a transfer function presenting a current gain instead of a voltage gain.

The technical problem is solved by a filter structure of the type set forth above and defiled in the characterising part of claims 1 and following.

The characteristics and advantages of the filter in accordance with the present invention are set forth in the description of an embodiment thereof given below by way of non-limiting example with reference to the annexed drawings.

BRIEF DESCRIPTION OF THE DRAWINGS

In the drawings:

FIG. 6 shows a variant embodiment of the filter of FIG. 4 incorporating a high-pass biquadratic cell in fully differential configuration.

DETAILED DESCRIPTION

Figure 1:
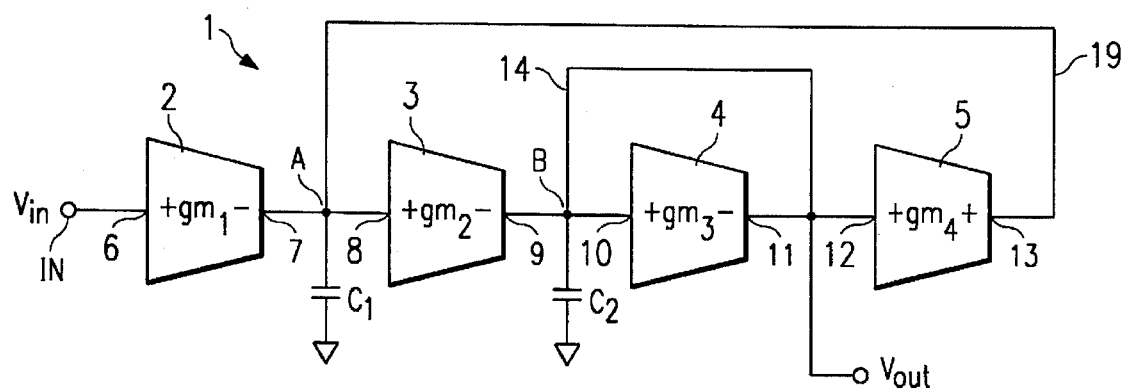
FIG. 1 shows schematically a low-pass biquadratic cell provided in accordance with the known art.
Figure 2:
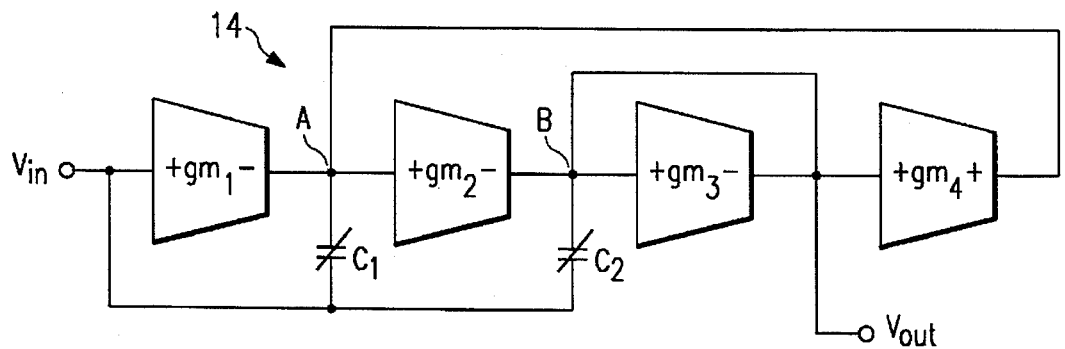
FIG. 2 shows schematically a first type of high-pass biquadratic cell provided in accordance with the known art.
Figure 3:
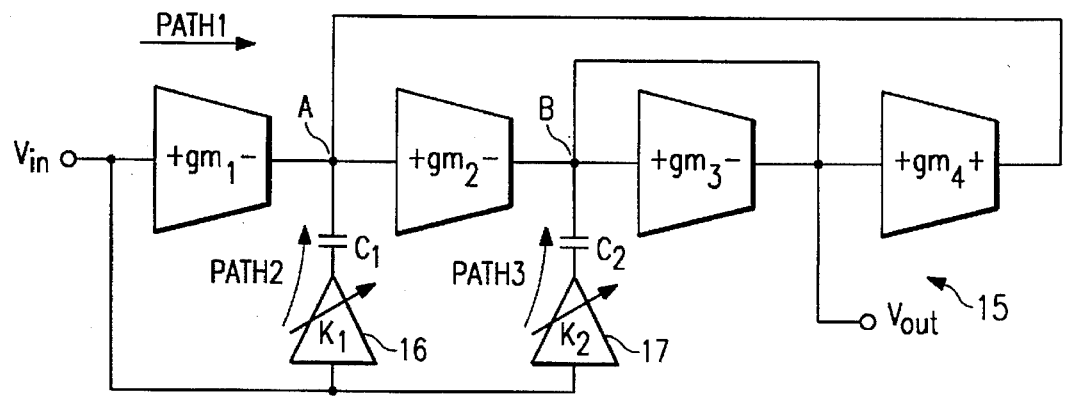
FIG. 3 shows schematically a second type of high-pass biquadratic cell provided in accordance with the known art.
Figure 4:
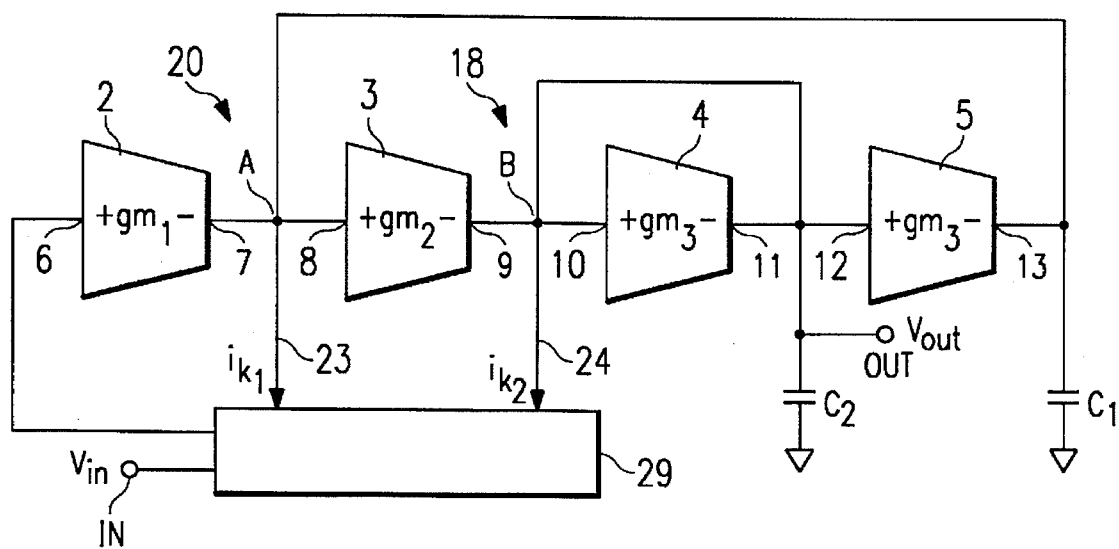
FIG. 4 shows schematically a high-pass filter structure provided in accordance with the present invention.

With reference to the embodiment of FIG. 4 reference number 20 indicates as a whole a high-pass filter structure provided in accordance with the present invention for high frequency applications. The filter 20 is first illustrated in a so-called single-ended configuration.

The filter 20 comprises a high-pass biquadratic cell 18 which has a structure similar to the low-pass cell 1 discussed above. In particular, even the high-pass biquadratic cell 18 exhibits circuitry nodes A and B upstream and downstream respectively of the second stage 3.

In the filter 20 the nodes A and B are connected to a current generator circuit 29 generating currents $i_{K1}$ and $i_{K2}$.

In addition the output terminal 13 of the fourth transconductance stage 5 is grounded by means of a capacitor C1.

Analogously the output terminal OUT coincident with the node B is grounded by means of another capacitor C2.

Advantageously in accordance with the present invention the current generator circuit 29 establishes for the currents $i_{K1}$ and $i_{K2}$ the following values:

$$i_{K1}=Vin*s*C_{K1}*A1$$

$$i_{K2}=Vin*s*C_{K2}*A2$$

where A1 and A2 represent variable current gains.

The transfer function of the biquadratic cell 20 thus becomes:

$$Vout/Vin=[gm1*gm2/(C1*C2)-s*(C_{K1}gm2)/(C1*C2)*A1-s2*C_{K2}/C2*A2]/(s2-s*(gm3/C2)-gm2*gm4/(C1*C2))$$

Figure 5:
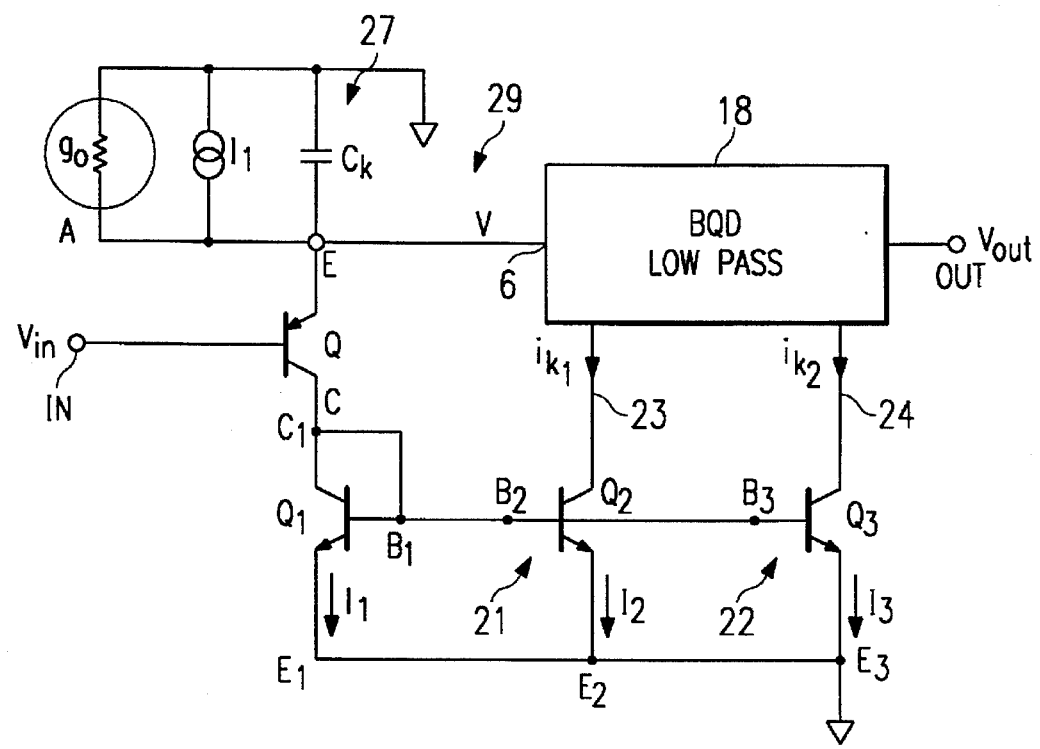
FIG. 5 shows schematically a detail of the filter of FIG. 4.

FIG. 5 shows in detail an embodiment of the current generator circuit 29 for the biquadratic cell 18 of the low-pass filter 20.

The circuit nodes A and B are connected to ground by means of a current mirror structure comprising a pair of bipolar npn transistors Q2 and Q3 respectively with respective base terminals B2 and B3 connected together and to the base terminal B1 of another bipolar npn transistor Q1.

The emitter terminals E1, E2 and E3 of the bipolar transistors Q1, Q2 and Q3 are all connected together and to the signal ground reference GND. Said terminals are traversed by bias currents I1, I2 and I3.

A first current mirror 21 comprises the transistors Q1 and Q2 while a second current mirror 22 comprises the transistors Q1 and Q3. The third bipolar npn transistor Q1 has base B1 and collector C1 short-circuited.

A first branch 23 of the mirror 21 is connected to the node A while a second branch 24 of the current mirror 22 is connected to the node B. The branches 23 and 24 lead to the collectors of threshold transistors Q2 and Q3.

A fourth bipolar pnp transistor Q is inserted in the current generator circuit 29 in connection with the third bipolar npn transistor Q1 and with the input 6 of the first stage 2.

Said bipolar pnp transistor Q has the collector terminal C connected to the collector C1 of the bipolar npn transistor Q1 and the emitter terminal E connected to the input 6.

In addition the emitter terminal E is connected to ground GND by means of an impedance 27 comprising the parallel of a capacitor $C_K$ and of a current generator I1 having an output conductance $g_O$. This impedance 27 consists essentially of a conductance parallel.

The bipolar pnp transistor Q receives on its base terminal B the input voltage Vin.

The current generator circuit 29 supplies to the input 6 of the high-pass biquadratic cell 18 a voltage V given by the product of Vin*H(s) where H(s) is a programmable factor determining the principal pole of the input structure.

In particular this programmable factor H(s) is given by:

$$H(s)=1/[1+(g_{CE}+g_O)/gm]*[1/(1+s*C_K/gm+g_{CE}+g_O)]$$

where:

$g_{CE}$ is the collector-emitter conductance of the bipolar transistor Q, and gm is the transconductance of the transistor Q.

This programmable factor H(s) is programmable by means of the variation of the relationships between the first current mirror 21 and the second current mirror 22. This variation is obtainable by modifying the mirror relationship between the transistors Q2/Q1 and Q3/Q1 and varying the bias currents I1, I2 and I3 in accordance with the following relationships:

$$V=Vin*H(s)$$

$$i_{K1}=Vin*(g_O+s*C_K)*H(s)*I2/I1$$

$$i_{K2}=Vin*(g_O+s*C_K)*H(s)*I3/I1$$

Advantageously in accordance with the present invention it is possible to work with broad input signals because the gain of the circuit 29 is a current gain instead than a voltage gain.

The double current mirror 21, 22 introduces in the transfer function of the low-pass filter 20 another pole having however a negligible effect on the total phase.

The presence of the programmable factor H(s) does not introduce distortions in the output signal of the high-pass biquadratic cell 18 because it is present in all the signals.

The high-pass filter 20 in accordance with the present invention does not exhibit floating capacitance, overcoming one of the problems afflicting the known art.

Now, with particular reference to the example of FIG. 6, there is discussed the filter structure with a high-pass biquadratic cell in fully differential configuration.

In this embodiment variation co-operating details and parts having the same structure and operation as the above embodiment are indicated by the same reference numbers and symbols.

In relation to the above solution the filter 20 exhibits double input terminals IN− AND IN+ which are inverting and non-inverting respectively and double output terminals OUT− and OUT+.

The biquadratic cell 28 incorporated in the filter 20 provides a cascade of differential stages 32, 33, 34 and 35 with transconductance.

Figure 7:
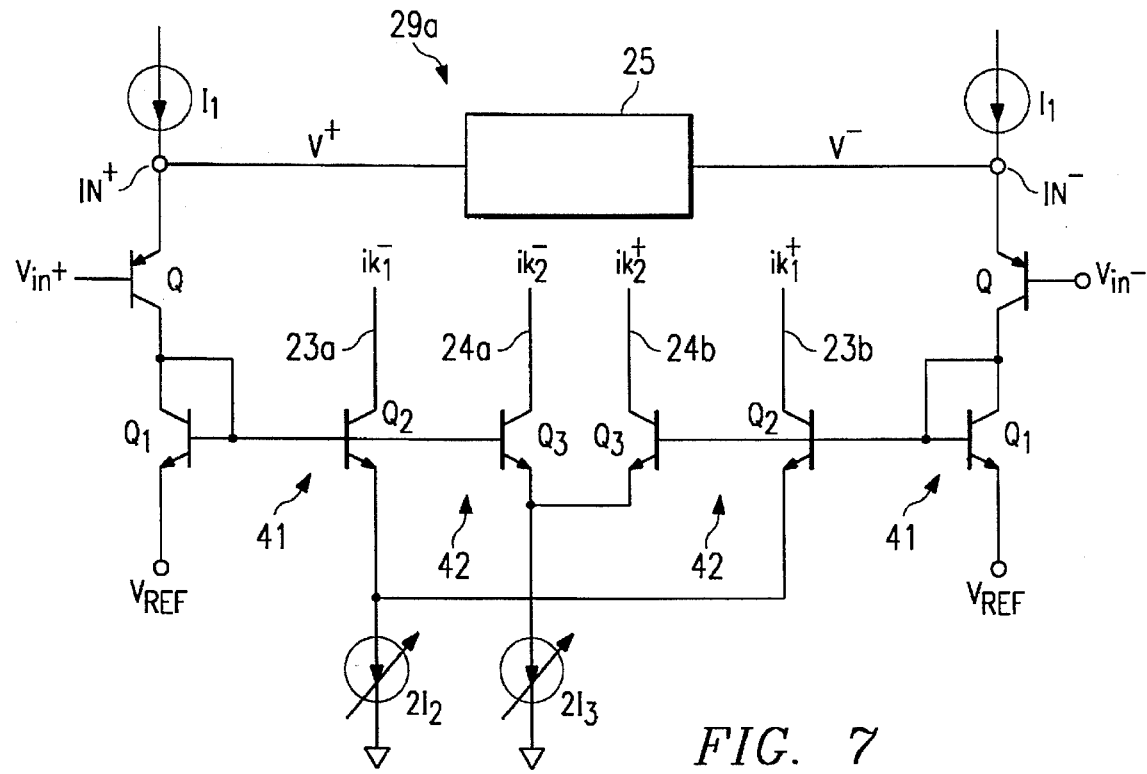
FIG. 7 shows a detail of the filter of FIG. 6.
Figure 8:
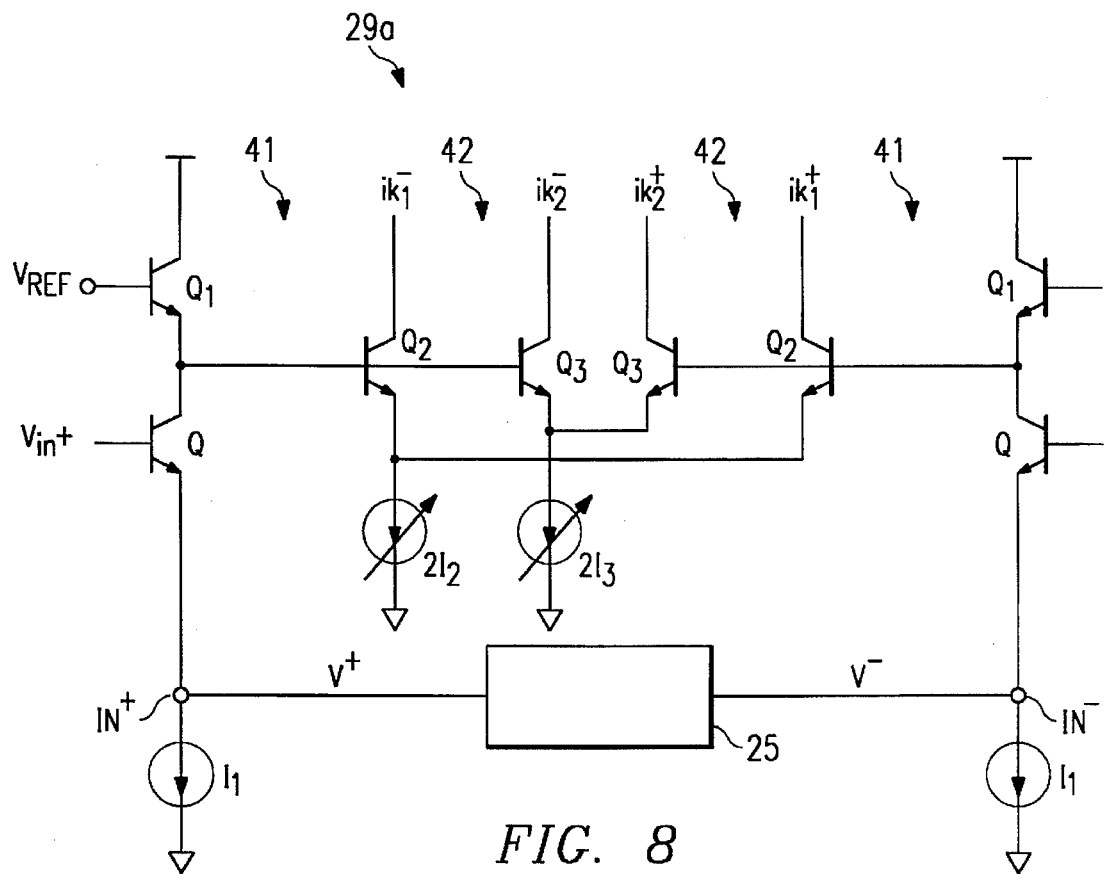
FIG. 8 shows another embodiment of the detail of FIG. 7, and FIGS. 9a, 9b and 9c show embodiments of a detail of FIGS. 7 and 8.

The generator circuit 29a provided again with bipolar technology is illustrated in FIGS. 7 and 8.

Analogously to the example of FIG. 5 there are provided respective current mirrors 41 and 42 connected between inputs and outputs of the second stage 33.

The first mirror 41 comprises the transistors Q1 and Q2 while the second mirror 42 comprises the transistors Q1 and Q3. Since the structure is the differential type the transistors were doubled in relation to the example of FIG. 5 and there are provided virtually double current mirrors 41 and 42 having respective branches 23a, 23b and 24a, 24b connected to the corresponding differential outputs of the stages 32 and 33.

The emitters of the transistors Q2 are connected to ground by means of a variable bias current generator 2I2.

Even the emitters of the transistors Q3 are connected to ground by means of a variable bias current generator 2I3.

By changing the bias currents I2 and I3 the mirror relationships are modified and hence the coefficients of the transfer function FdT of the filter change. Basically, the coefficients which are modified are just those present at the numerator of the transfer function FdT and hence the "zeroes".

A compensation block 25 is inserted between the differential inputs IN– and IN+ of the biquadratic cell 28. FIGS. 9a, 9b and 9c show possible alternative embodiments of said compensation block 25 incorporating a pair of capacitors $C_K$ in series or parallel. In the example of FIG. 9c the pair of capacitors $C_K$ is connected between the differential inputs IN+,IN– and a signal ground.

To complete the description, FIG. 8 shows an embodiment of the current generator circuit 29 comprising only bipolar npn transistors. The different arrangement of the compensation block 25 and transistors Q and Q1 is quite clear to those skilled in the art.

Even an embodiment of the current generator circuit 29 with CMOS technology is easy to define by means of a regular replacement of the bipolar npn transistors with N-channel MOS transistors and an analogous replacement of the bipolar pnp transistors with P-channel MOS transistors.

It is clear that modification, integration and replacement of elements can be made to the filter described above by way of nonlimiting example without thereby going beyond the protective scope of the following claims.

We claim:

1. A programmable zeros filter for high-frequency applications comprising:
    an input terminal and an output terminal, the relationship between the Laplace transform of said input terminal and said output terminal defining a transfer function;
    a biquadratic cell having an input and a series of transconductance stages;
    a generator circuit for receiving signals from said input terminal to generate variable currents which are dynamically varied in accordance with said signals received at said input terminal, said generator circuit being connected respectively to said input of said biquadratic cells, and to first and second nodes which are between respective pairs of stages of said biquadratic cell; and
    wherein said generator circuit further comprises means for adjusting respective bias current components of said variable currents.

2. Filter in accordance with claim 1 wherein said generator circuit comprises a current mirror having a first branch connected to said first node and a second branch connected to said second node.

3. Filter in accordance with claim 1, wherein said generator circuit further comprises an impedance coupled between said input terminal and ground.

4. Filter in accordance with claim 3 characterised in that said impedance comprises the parallel of a capacitor and of a current generator having a predetermined output conductance.

5. Filter in accordance with claim 2 characterised in that the mirror relationship between said first branch of said current mirror and said second branch of said current mirror is programmable.

6. Filter in accordance with claim 1 said biquadratic cell implements a current gain.

7. A programmable-zeros filter comprising:
    a plurality of transconductance stages interconnected at respective nodes to form a filter network having an input terminal and an output terminal;
    a current mirror stage, connected to said input terminal of said filter network and connected to receive an input signal at its input to provide multiple separate current outputs which are proportional to said input signal; said multiple current outputs each being connected to a respective one of said respective nodes of said filter network;
    wherein said filter network provides a filtered signal at said output, which corresponds to a filtering of said input signal with a desired transfer function;
    whereby poles of said transfer function are varied by varying said current mirror stage.

* * * * *